(12) United States Patent
Nakatake

(10) Patent No.: US 8,803,508 B2
(45) Date of Patent: Aug. 12, 2014

(54) SEMICONDUCTOR DEVICE AND ERROR DETECTOR

(75) Inventor: Hiroshi Nakatake, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 177 days.

(21) Appl. No.: 13/388,457

(22) PCT Filed: Jun. 17, 2010

(86) PCT No.: PCT/JP2010/060283
§ 371 (c)(1),
(2), (4) Date: Feb. 2, 2012

(87) PCT Pub. No.: WO2011/048845
PCT Pub. Date: Apr. 28, 2011

(65) Prior Publication Data
US 2012/0126791 A1     May 24, 2012

(30) Foreign Application Priority Data

Oct. 20, 2009   (JP) .................................. 2009-241408

(51) Int. Cl.
*G01R 19/00* (2006.01)
(52) U.S. Cl.
USPC ....................................................... 324/123 R
(58) Field of Classification Search
USPC ............................. 324/123 R, 762.01–762.1, 324/750.01–750.3; 257/48; 438/14–18
See application file for complete search history.

(56) References Cited

U.S. PATENT DOCUMENTS

| 5,621,601 A | | 4/1997 | Fujihira et al. |
| 5,999,007 A | * | 12/1999 | Kimura .................... 324/750.05 |
| 6,084,760 A | | 7/2000 | Nomura |
| 7,157,748 B2 | * | 1/2007 | Saito et al. ..................... 257/192 |

(Continued)

FOREIGN PATENT DOCUMENTS

| JP | 61 8319 | 1/1986 |
| JP | 01 227520 | 9/1989 |

(Continued)

OTHER PUBLICATIONS

International Search Report Issued Sep. 7, 2010 in PCT/JP10/60283 Filed Jun. 17, 2010.

(Continued)

*Primary Examiner* — Tung X Nguyen
(74) *Attorney, Agent, or Firm* — Oblon, Spivak, McClelland, Maier & Neustadt, L.L.P.

(57) ABSTRACT

In a semiconductor device utilizing a power semiconductor element provided with a main cell and a current sensing cell, a load overcurrent is accurately detected and a short circuit current is rapidly detected. The output of a current sensing cell is connected to an inverting input terminal of an operational amplifier, and a non-inverting input terminal of the operational amplifier is connected to the source of the main cell. A current/voltage conversion circuit configured with the operational amplifier and a sensing resistor converts an output current of the current sensing cell into a sensing voltage. A first error detection circuit compares the sensing voltage with a first reference voltage and outputs an error signal. A second error detection circuit compares a voltage at the inverting input terminal of the operational amplifier with a second reference voltage set to be higher than a source-bias voltage and outputs an error signal.

11 Claims, 9 Drawing Sheets

(56) References Cited

U.S. PATENT DOCUMENTS

| | | | |
|---|---|---|---|
| 7,737,718 B2 * | 6/2010 | Koura | 324/762.01 |
| 2007/0103951 A1 | 5/2007 | Ishikawa et al. | |
| 2008/0198526 A1 | 8/2008 | Hiyama | |

FOREIGN PATENT DOCUMENTS

| | | |
|---|---|---|
| JP | 02 288615 | 11/1990 |
| JP | 2-288615 A | 11/1990 |
| JP | 07 146722 | 6/1995 |
| JP | 7-146722 A | 6/1995 |
| JP | 11 18410 | 1/1999 |
| JP | 11 299218 | 10/1999 |
| JP | 2005-55373 A | 3/2005 |
| JP | 2007 135252 | 5/2007 |
| JP | 2008 206348 | 9/2008 |

OTHER PUBLICATIONS

Office Action issued Dec. 7, 2012 in German Patent Application No. 11 2010 003 655.1 (with English-language translation).

* cited by examiner

US 8,803,508 B2

SEMICONDUCTOR DEVICE AND ERROR DETECTOR

TECHNICAL FIELD

The present invention relates to a semiconductor device that utilizes a power semiconductor element, such as an MOSFET, that is provided with a current sensing cell for obtaining a current-detection current by splitting a current flowing therein.

BACKGROUND ART

Among semiconductor devices utilizing a power semiconductor element, there exists a semiconductor device provided with a current sensing cell that obtains a current for a current-detection by splitting a current flowing in the power semiconductor element, in order to detect a current so as to protect the power semiconductor element when an overcurrent flows therein. An overcurrent protector for a transistor utilizing a current flowing in the current sensing cell include an overcurrent protector for a transistor in which a current detection means formed of a resistor receives a current from a current-detection transistor (a current sensing cell) and inputs the current to a comparator, so that a current is detected (e.g., Patent Document 1).

In addition, overcurrent detection circuits include the one in which current detection is performed in such a way that a current-detection source (the output of a current sensing cell) is connected to the inverting input terminal of an operational amplifier in a current/voltage conversion circuit configured with the operational amplifier and a current detection resistor (e.g., Patent Document 2).

PRIOR ART REFERENCE

Patent Document

[Patent Document 1] Japanese Patent Application Laid-Open No. H7-146722 (46th line in left column to 16th line in right column of page 4)
[Patent Document 2] Japanese Patent No. 2658386 (FIG. 1)

DISCLOSURE OF THE INVENTION

Problems to be Solved by the Invention

A current sensing cell is utilized for protecting a power semiconductor element by detecting mainly two currents stated below. The first current will be explained. In such a three-phase two-level inverter as illustrated in FIG. 2, in the case where for some causes, both the high-side switch (e.g., 1a) and a low-side switch (e.g., 1b) of a given phase concurrently turn on, a low impedance causes a short circuit between both terminals of a power source, whereby a current flowing in a semiconductor element increases at a high current changing speed, i.e., there is produced a so-called arm shorting current. Because the arm shorting current becomes large enough to break a power semiconductor element, it is required to detect a current flowing in the power semiconductor element so as to protect the power semiconductor element.

In the three-phase two-level inverter illustrated in FIG. 2, the second current is a current that passes through the high-side switch (e.g., 1a) of a given phase, a load M, and the low-side switch (e.g., 1d) of another phase and then returns to the power source. Because it increases while passing through the load M, the current gently increases. Because the current increases gently, even in the case where for some causes, a power semiconductor element, which should be turned off, continues to turn on and hence an overcurrent flows, high-speed current detection is not required; however, high-accuracy current detection is required. The reason why high-accuracy current detection is required is as follows. In general, with regard to an power converter including the inverter in FIG. 2, a dedicated cooling device is designed in order to cool a power semiconductor element. The design is performed in such a way that the cooling can be carried out even at a maximum current, which is allowed to flow in the power converter, and that there exists an appropriate margin. The more accurately the maximum current, on which the current detection is based, can be detected, the more appropriately the design of the cooling device can be carried out. The current changing speed at a time when the power semiconductor element turns off increases as the current to be cut off becomes larger. The parasitic inductance and the turn off speed are designed in such a way that even when the current changing speed is maximum, the surge voltage expressed by the product of the current changing speed and the parasitic inductance does not exceed the maximum rated voltage of the power semiconductor element. The more accurately the maximum current can be detected, the more appropriately the design of the parasitic inductance and the turn off speed can be carried out.

As described above, what are required when the current detection is performed are the following two points, i.e., high-speed detection of an arm shorting current and high-accuracy detection of a load current.

In Patent Document 1, with regard to the requirement for the current detection, the current detection means formed of a resistor receives a current of a current-detection transistor and inputs the current to a comparator, so that the current is detected. In this case, because the speed of the comparator is relatively high, a current can rapidly be detected. However, because the current detection means formed of a resistor is connected between the source of the current-detection transistor and the source of a main transistor, the voltage between the drain and the source of the main transistor and the voltage between the drain and the source of the current-detection transistor are different from each other by a voltage equal to the voltage drop across the current detection means. The output characteristic is represented in FIG. 9. Because the respective voltages between the drain and the source are different from each other, the respective drain currents of the main transistor and the current detection transistor are different from each other and hence the accuracy cannot be raised.

In Patent Document 2, there is utilized a current/voltage conversion circuit configured with an operational amplifier and a current detection resistor. In its steady operation, an operational amplifier operates in such a way as to cancel a difference in the potential between the non-inverting terminal and the inverting terminal thereof; therefore, there is produced no difference between the voltage between the drain and the main source of an output MOSFET and the voltage between the drain and the current-detection source thereof, whereby a current can accurately be detected. However, transiently, there exists an upper limit in the change of output-terminal voltage of an operational amplifier; therefore, a current cannot rapidly be detected. In other words, an operational amplifier is not suitable for arm shorting current detection in which high-speed detection is required.

The present invention has been implemented in order to solve the foregoing problems; the objective thereof is to obtain a semiconductor device utilizing a power semiconductor element provided with a main cell and a current sensing cell in which an arm shorting current is rapidly detected and a load overcurrent is accurately detected.

Means for Solving the Problems

In a semiconductor device according to the present invention, an output of a current sensing cell is connected to an inverting input terminal of an operational amplifier, and a non-inverting input terminal of the operational amplifier is connected to the source of a main cell, to which a source-bias voltage is applied; a current/voltage conversion circuit configured with the operational amplifier and a sensing resistor converts an output current of the current sensing cell into a sensing voltage; and there are provided a first error detection circuit that compares the sensing voltage with a first reference voltage and outputs an error signal and a second error detection circuit that compares a voltage at the inverting input terminal of the operational amplifier with a second reference voltage set to be higher than the source-bias voltage and outputs an error signal.

Advantage of the Invention

According to the present invention, there can be obtained a semiconductor device in which the first error detection circuit can accurately detect a load overcurrent and the second error detection circuit can rapidly detect a shortcircuit current.

BRIEF DESCRIPTION OF THE DRAWINGS

FIG. 3 is a chart representing the operation of a semiconductor device according to Embodiment 1 of the present invention at a time when the semiconductor device turns on.

EMBODIMENTS FOR CARRYING OUT THE INVENTION

Embodiment 1

Figure 1:
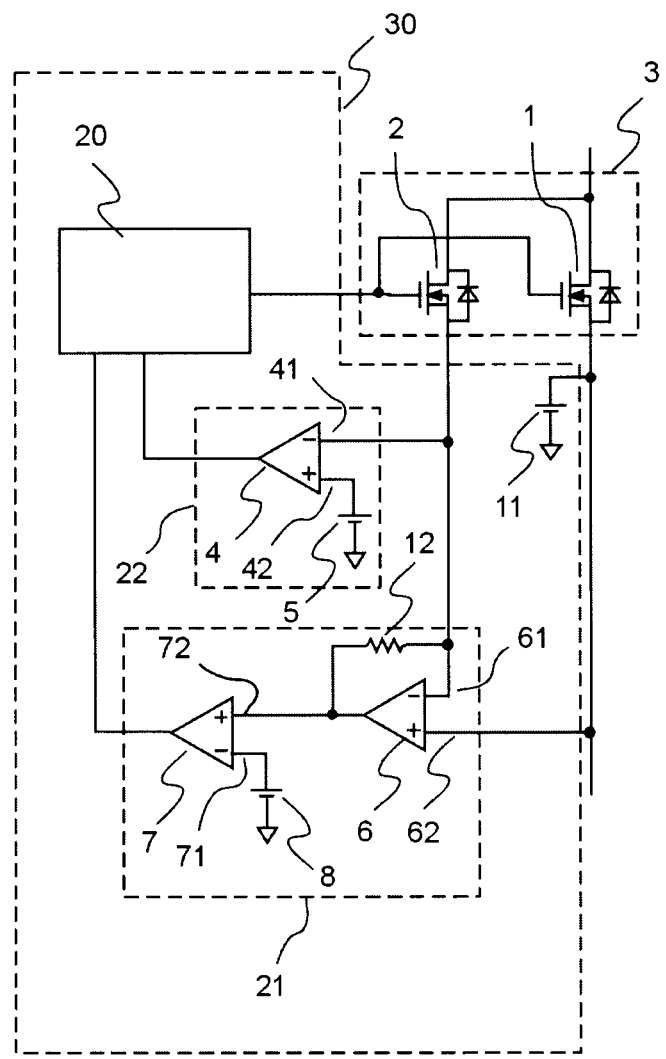
FIG. 1 is a circuit diagram illustrating a semiconductor device according to Embodiment 1 of the present invention.

FIG. 1 is a circuit diagram illustrating a semiconductor device according to Embodiment 1 of the present invention. In Embodiment 1, as a power semiconductor element, a MOSFET (Metal Oxide Semiconductor Field Effect Transistor) is utilized; however, other power semiconductor elements such as an IGBT (Insulated Gate Bipolar Transistor) and the like may be utilized. A power semiconductor element 3 is provided with a main cell 1 that functions mainly to pass a current and a current sensing cell 2 that splits a current; the respective drains of the main cell 1 and the current sensing cell 2 are connected with each other, and the respective gates thereof are connected with each other. A source-bias power source 11 for applying a negative voltage (a bias voltage) between the gate and the source of a power semiconductor element is connected to the source of the main cell 1. The source terminal of the current sensing cell 2 is connected to the inverting input terminal 61 of the operational amplifier 6; a sensing resistor 12 is connected between the inverting input terminal 61 and the output terminal of the operational amplifier 6. A non-inverting input terminal of the operational amplifier 6 is connected to the source terminal of the main cell 1. The operational amplifier 6 and the sensing resistor 12 configure a current/voltage conversion circuit that converts the output current of the current sensing cell into a sensing voltage, which is the voltage at the output terminal of the operational amplifier. The output terminal of the operational amplifier 6 is connected to a non-inverting input terminal 72 of a comparator 7; a reference power source 8 that supplies a first reference voltage is connected to an inverting input terminal 71 of the comparator 7; the voltage at the output terminal of the operational amplifier, i.e., the sensing voltage is compared with the first reference voltage. In the case where the sensing voltage is lower than the first reference voltage, the comparator 7 outputs an error signal. The operational amplifier 6, the sensing resistor 12, the reference power source 8, and the comparator 7 configure a first error detection circuit 21.

An inverting input terminal 41 of a comparator 4 is connected to the inverting input terminal 61 of the operational amplifier 6, and a reference power source 5 that supplies a second reference voltage is connected to a non-inverting input terminal 42 of the comparator 4. The comparator 4 compares the second reference voltage with the voltage at the inverting input terminal 41 of the comparator 4, i.e., at the inverting input terminal 61 of the operational amplifier 6; in the case where the voltage at the inverting input terminal 61 of the operational amplifier 6 is higher than the second reference voltage, the comparator 4 outputs an error signal. The comparator 4 and the reference power source 5 configure a second error detection circuit 22. A control circuit 20 receives the error signal from the comparator 4 or the comparator 7, and outputs a switching command to the respective gate terminals of the main cell 1 and the current sensing cell 2 of the power semiconductor element so as to turn off the main cell 1 and the current sensing cell 2. In such a way as described above, a current detection circuit 30 is configured.

Figure 2:
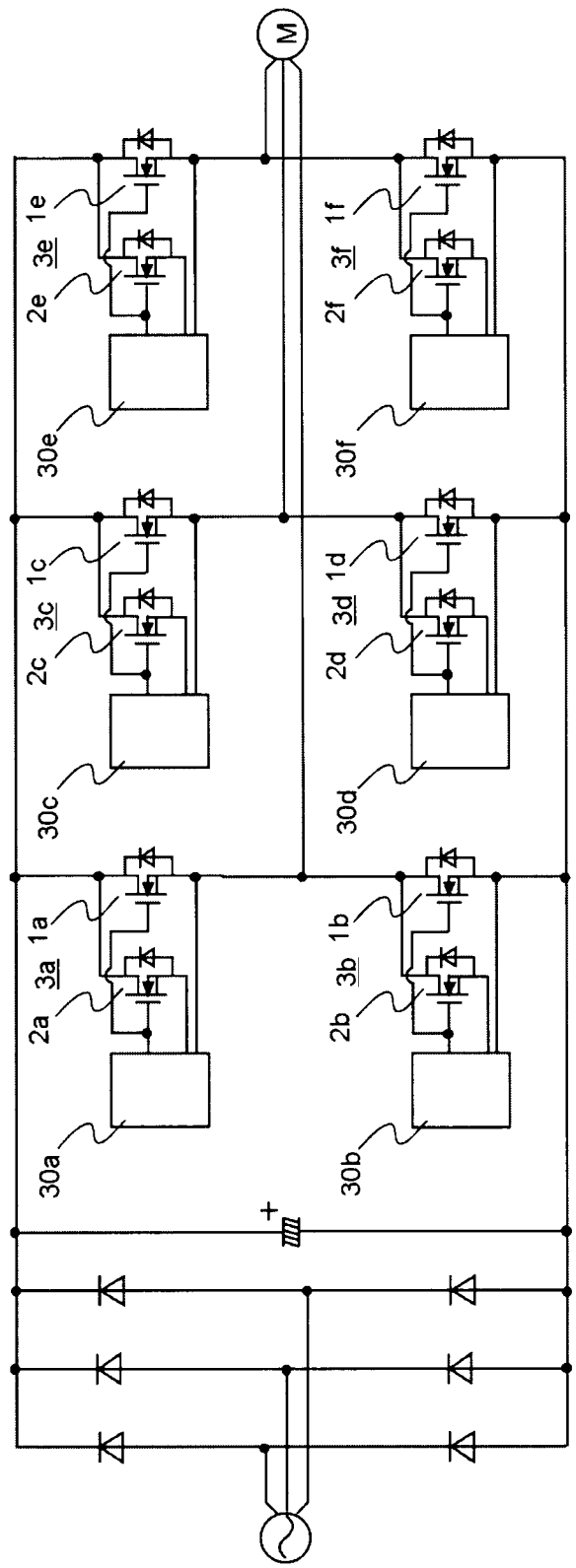
FIG. 2 is a circuit diagram illustrating an example to which the present invention is applied.

The circuit illustrated in FIG. 1 is applied, for example, to a three-phase two-level inverter illustrated in FIG. 2. The circuit in FIG. 2 is configured with six FIG. 1-*illustrated* circuits. In FIG. 2, each of Reference Characters 3*a*, 3*b*, 3*c*, 3*d*, 3*e*, and 3*f* denotes the power semiconductor element 3 in FIG. 1; each of Reference Characters 1*a*, 1*b*, 1*c*, 1*d*, 1*e*, and 1*f* denotes the main cell 1; each of Reference Characters 2*a*, 2*b*, 2*c*, 2*d*, 2*e*, and 2*f* denotes the current sensing cell 2; each of Reference Characters 30*a*, 30*b*, 30*c*, 30*d*, 30*e*, and 30*f* denotes the current detection circuit 30. In Embodiment 1, the load is the motor M; however, anything may be the load. In addition, it goes without saying that the present invention can be applied not only to three-phase two-level inverter, described herein as an example, but also to various kinds of electric power apparatuses.

Figure 3:
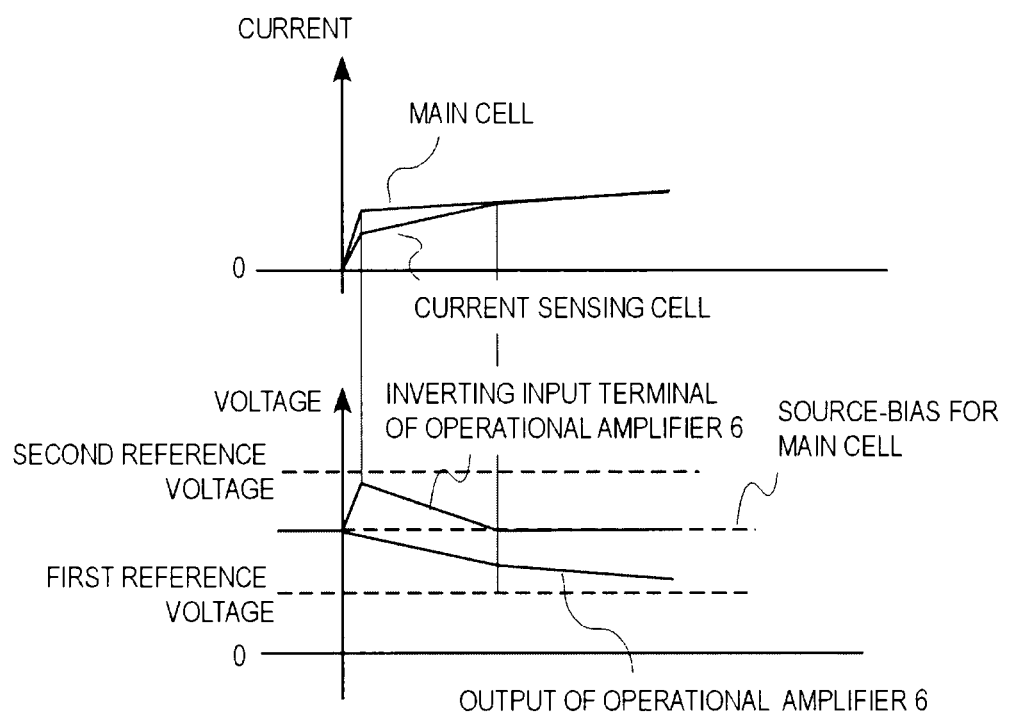

FIG. 3 is an explanatory chart for explaining the operation of Embodiment 1, i.e., the circuit in FIG. 1 at a time when it turns on; there is represented the operation at a time when the current value does not exceed an overcurrent setting value. In FIG. 3, the upper part shows the respective current changes in the main cell and the current sensing cell; the lower part shows the respective voltage changes in some points. Each of the main cell 1 and the current sensing cell 2 is configured with a plurality of cells; the ratio of the number of cells of the main cell 1 to the number of cells of the current sensing cell 2 is several thousands to several tens of thousands. In FIG. 3, the output current of the current sensing cell is multiplied by the cell-number ratio, so that the scale of the current sensing cell is the same as that of the main cell.

Before turning-on, the voltage at the inverting input terminal 61 of the operational amplifier 6 becomes equal to the voltage at the non-inverting input terminal 62 thereof, i.e., the source-bias voltage for the main cell 1, due to the virtual shortcircuit of the input terminals of the operational amplifier. When turning-on starts, a current flows from the source of the current sensing cell 2 into the output terminal of the operational amplifier 6, by way of the sensing resistor 12. The output voltage (sensing voltage) of the operational amplifier 6 reduces in such a way that the respective potentials of the non-inverting input terminal 62 and the inverting input terminal 61 of the operational amplifier 6 become equal to each other; however, because the voltage changing speed (referred to as a slew rate) thereof is limited, the voltage at the inverting input terminal 61 of the operational amplifier 6 does not become equal to the source voltage of the main cell 1 but rises. That is to say, the virtual shortcircuit is not caused between the non-inverting input terminal 62 and the inverting input terminal of the operational amplifier 6 and hence the respective voltage of both the terminals differ from each other. In this situation, the voltage at the inverting input terminal 61 of the operational amplifier 6 rises at a speed obtained by subtracting the slew rate from the product of the temporal change in the output current of the current sensing cell 2 and the resistance of the sensing resistor 12.

The present invention has been implemented by ingeniously utilizing the state where the virtual shortcircuit of the operational amplifier is broken. In the case where the input terminals of the operational amplifier 6 are in an ideal condition, i.e., always in the state of the virtual shortcircuit, the voltage at the inverting input terminal 41, of the comparator 4, that is connected to the inverting input terminal 61 of the operational amplifier 6 is always equal to the voltage at the non-inverting input terminal 62 of the operational amplifier 6, i.e., equal to the source-bias voltage, which is the source voltage of the main cell 1 of the power semiconductor element 3; thus, the comparator 4 does not work at all (refer to the explanation for FIG. 4). However, from the analysis by the inventors of the present invention, it has been learned that in the case where the current sensing cell 2 rapidly rises, the voltage at the inverting input terminal 61 of the operational amplifier 6 departs from the voltage at the non-inverting input terminal 62, i.e., the source-bias voltage for the main cell, as represented in FIG. 3, during a period in which the operational amplifier cannot follow a change in the current, and hence the change in the voltage at the inverting input terminal 61 reflects the current rise in the current sensing cell 2.

The first reference voltage is set to be equal to the output voltage of the operational amplifier 6 at a time when an overcurrent flows in the load. Accordingly, when the current in the main cell is smaller than the load overcurrent, i.e., when normal operation is performed, the comparator 7 does not output the error signal.

Figure 4:
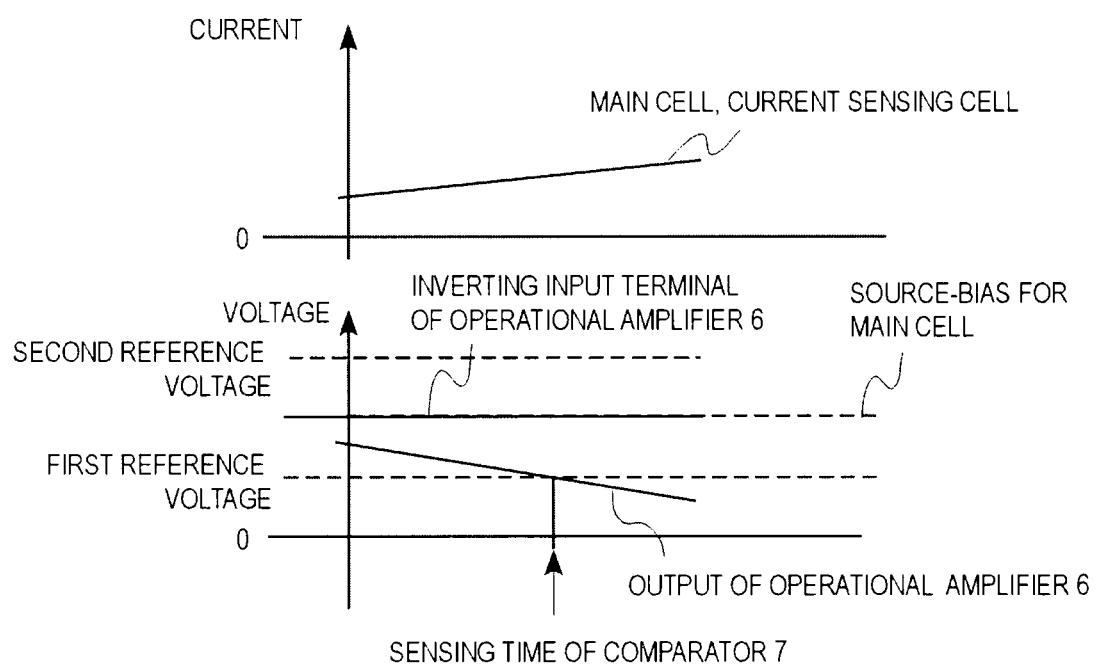
FIG. 4 is a chart representing the operation of a semiconductor device according to Embodiment 1 of the present invention at a time when an overcurrent flows in a load.

Next, with reference to FIG. 4, there will be explained a case where an overcurrent flows in the load, i.e., the operation at a time when an overcurrent flows in the load. Because when an overcurrent flows, the current changes while passing through the load, the current gently changes. Accordingly, the slew rate of the operational amplifier 6 exceeds the product of the temporal change in the output current of the current sensing cell 2 and the resistance of the sensing resistor 12. As a result, the difference between the voltage at the inverting input terminal 61 of the operational amplifier 6 and the voltage at the non-inverting input terminal 62 thereof becomes approximately "zero", and the voltage at the output terminal of the operational amplifier 6 reduces at a rate of the product of the resistance of the sensing resistor 12 and the temporal change in the output current of the current sensing cell 2. When the output voltage of the operational amplifier 6 becomes lower than the first reference voltage, it is determined that an overcurrent is produced, and the comparator 7 transmits the error signal to the control circuit 20. Because the voltage between the drain and the source of the main cell 1 and the voltage between the drain and the source of the current sensing cell 2 are almost equal to each other, the current in the main cell 1 and the current obtained by multiplying the current in the current sensing cell 2 by the cell-number ratio become approximately equal to each other; thus, the load overcurrent can accurately be detected. In addition, when an overcurrent flows in the load, the voltage at the inverting input terminal of the operational amplifier 6, i.e., the voltage at the inverting input terminal 41 of the comparator 4 is equal to the source-bias voltage for the main cell; because the second reference voltage is set to be higher than the source-bias voltage, the comparator 4 does not detect the load overcurrent, whereby deterioration in the detection accuracy can be prevented.

Figure 5:
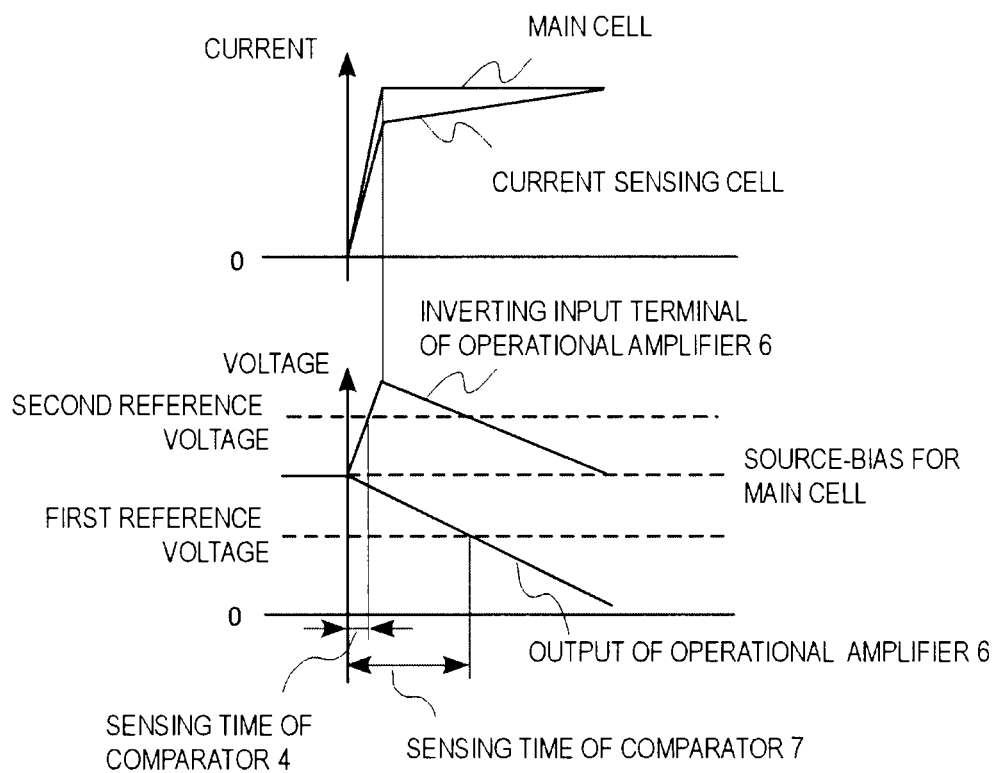
FIG. 5 is a chart representing the operation of a semiconductor device according to Embodiment 1 of the present invention at a time when an arm thereof is short-circuited.

Next, the operation at a time when an arm is short-circuited will be explained with reference to FIG. 5. Because the current at a time when an arm is short-circuited is larger than a load overcurrent (for example, five times as large as a load overcurrent) and the current changing speed thereof is also large, the voltage at the inverting input terminal of the operational amplifier 6 rapidly rises, as represented in FIG. 5, due to the breakage of the state of the virtual shortcircuit; therefore, when the second reference voltage is appropriately set, the voltage at the inverting input terminal 61 of the operational amplifier 6 exceeds the second reference voltage. Accordingly, the arm shorting current is detected, based on the output of the comparator 4 whose inverting input terminal 41 is connected to the inverting input terminal 61 of the operational amplifier 6. In general, there exists a trade-off relationship between the slew rate of an operational amplifier and the cost thereof, the accuracy thereof, or the power consumption thereof. Even in the case where priority is placed on other performances and an operational amplifier having a small slew rate is utilized, the response speed of a comparator is far higher than the slew rate of the operational amplifier 6; therefore, the detection time of the comparator 4 becomes shorter than that of the comparator 7, whereby the arm short-circuit can rapidly be detected.

During a period in which the voltage at the inverting input terminal 61 of the operational amplifier 6 and the voltage at the non-inverting input terminal 62 thereof are different from each other, the voltage between the drain and the source of the current sensing cell 2 differs from that of the main cell 1; therefore, the current obtained by multiplying the source current (output current) of the current sensing cell 2 by the cell-number ratio differs from the source current of the main cell 1. The source current changes, also due to variations among chips, variations in temperature characteristics, variations caused by different chip temperatures, and the like. For the purpose of preventing an overcurrent from being erroneously detected even when in the normal operation, the source current varies due to the foregoing causes, it is required that the second reference voltage for making the comparator 4 operate is set to a value with a margin with respect to the value corresponding to the maximum rated current (e.g., approximately twice as large as the maximum rated current value).

When the slew rate of the operational amplifier 6 is faster than the product of the temporal change in the output current of the current sensing cell 2 and the resistance of the sensing resistor 12, the first detection circuit 21 may detect even an arm shortcircuit. The slew rate of an operational amplifier and the temporal change in the current of a power semiconductor element vary in various manners; however, as the present invention, by concurrently utilizing both the first error detection circuit and the second error detection circuit, an arm shortcircuit can constantly be detected in a rapid manner while the slew rate of an operational amplifier and the temporal change in the current of a power semiconductor element vary in various manners.

When an arm shorting current flows, control of turning off the main cell and the current sensing cell is performed, in practice, based on the detection time of the comparator 4 in FIG. 5; thus, the current is reduced. In FIG. 5, in order to explain the difference between the detection time of the comparator 4 and the detection time of the comparator 7, there is symbolically represented a case where even after the detection time of the comparator 4 the main cell and the current sensing cell are kept to be on and the power semiconductor element does not break, whereby the current thereof continues to flow.

As described above, the operation of the second error detection circuit according to the present invention is completely different from the operation of the current detection in Patent Document 1. That is to say, in Patent Document 1, a resistor, which is a current detection means, is connected to the output terminal of the current sensing cell, and the voltage produced across the resistor is inputted to the inverting input terminal of the comparator. In Patent Document 1, the inverting input terminal of the comparator is not connected to the inverting input terminal of the operational amplifier, although in the present invention, it is connected to the inverting input terminal of the operational amplifier; therefore, the comparator operates without undergoing any effect of the virtual shortcircuit in the operational amplifier. In Patent Document 1, the voltage at the inverting input terminal of the comparator always corresponds to the current outputted by the current sensing cell; thus, the comparator detects even an overcurrent, such as a load overcurrent, that changes relatively slowly, although the detection accuracy is low. In contrast, in the present invention, the comparator 4 detects only an overcurrent, such as an arm shorting current, that changes rapidly and can be neither followed nor detected by the operational amplifier 6, and the operational amplifier 6 detects an overcurrent that changes relatively slowly and can be followed by the operational amplifier 6. The comparator 4 according to the present invention cannot detect a current that changes relatively slowly and can be followed by the operational amplifier 6, due to the effect of the virtual shortcircuit of the input terminal of the operational amplifier 6.

Embodiment 2

Figure 6:
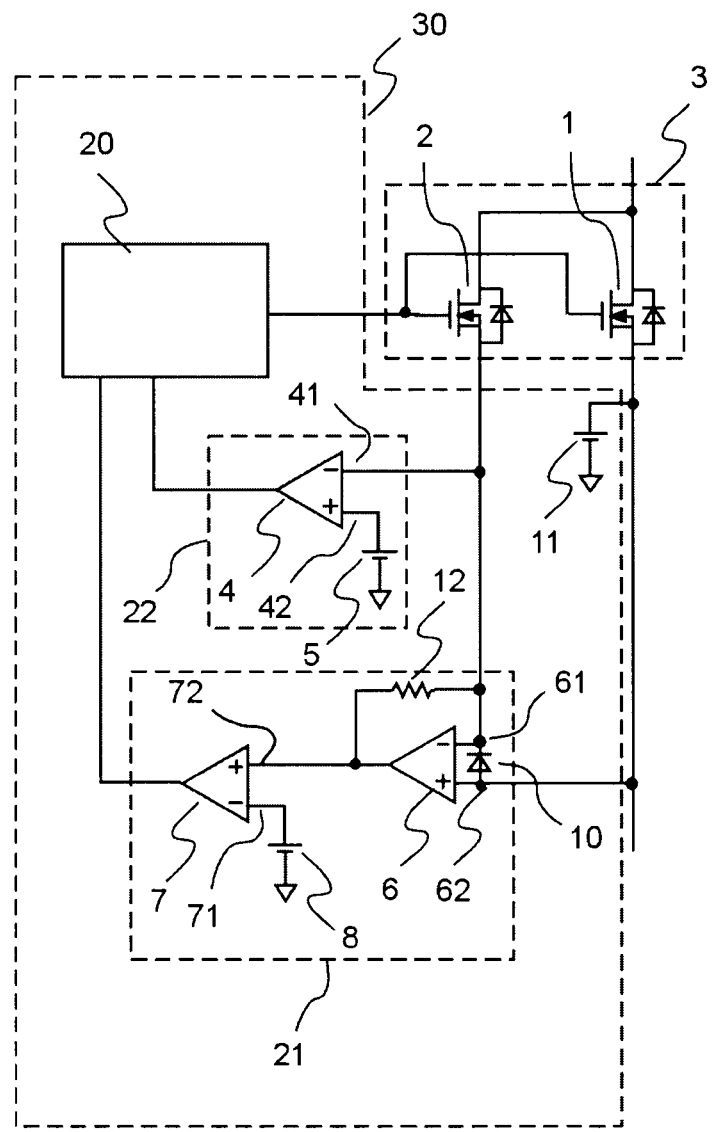
FIG. 6 is a circuit diagram illustrating a semiconductor device according to Embodiment 2 of the present invention.

FIG. 6 is a circuit diagram illustrating a semiconductor device according to Embodiment 2 of the present invention. In FIG. 6, the same reference numerals as those in FIG. 1 denote the same or equivalent components or elements. In Embodiment 2, in addition to Embodiment 1, a diode 10 is connected between the non-inverting input terminal 62 and the inverting input terminal 61 of the operational amplifier 6 in such a way that the anode thereof is connected to the non-inverting input terminal 62 and the cathode thereof is connected to the inverting input terminal 61.

Figure 7:
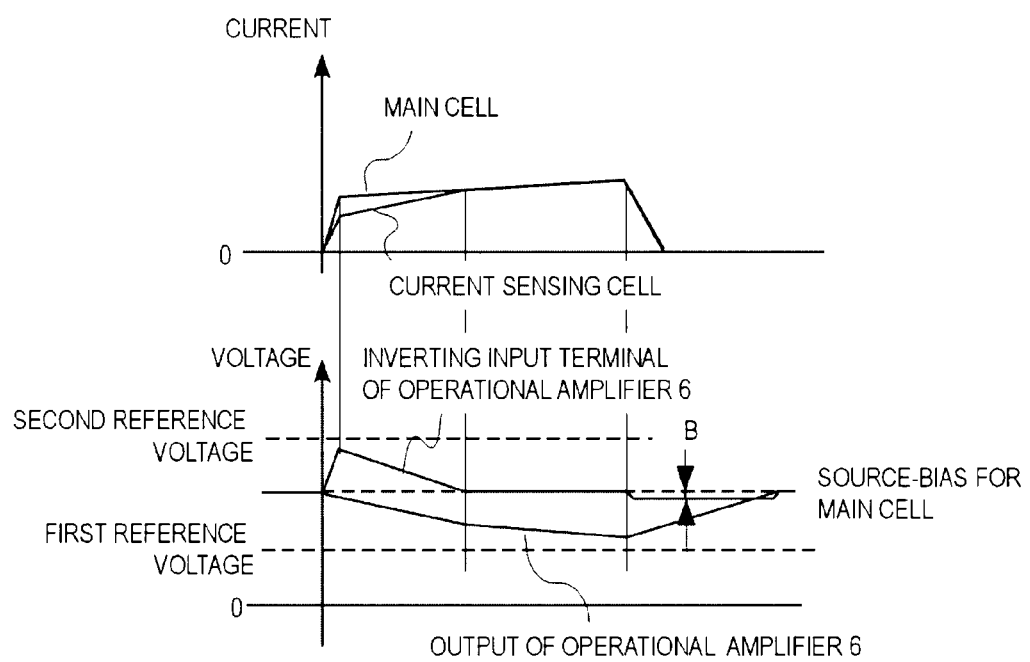
FIG. 7 is a chart representing the operation of a semiconductor device according to Embodiment 2 of the present invention in the period from a time when the semiconductor device turns on to a time point when the semiconductor device turns off.

The diode 10 affects the change in the voltage at the inverting input terminal 61 of the operational amplifier 6 when the power semiconductor element turns off. FIG. 7 represents the operational sequence, in the circuit in FIG. 6, of a power semiconductor element in the normal period (in which no overcurrent flows) from a time when the power semiconductor element turns on to a time point when the power semiconductor element turns off. When the power semiconductor element turns on, the operation thereof is completely the same as the operation of Embodiment 1, i.e., FIG. 3. As is the case where the power semiconductor element turns on, when the power semiconductor element turns off, there is also produced a difference between the voltage at the inverting input terminal of the operational amplifier 6 and the source-bias voltage for the main cell 1, due to the limitation on the slew rate of the operational amplifier 6; however, because diode 12 performs clamping between the inverting input terminal 61 and the non-inverting input terminal 62, the voltage at the inverting input terminal 61 of the operational amplifier 6 and the source-bias voltage for the main cell 1 do not largely differ from each other; thus, the difference is only the maximum forward voltage of the diode (the difference indicated by "B" in FIG. 7). Accordingly, because the off period is short, there is no delay in the detection of an arm shortcircuit, which is caused due to the decrease in the voltage at the inverting input terminal of the operational amplifier 6, even in the case where the arm shortcircuit is caused when the power semiconductor element turns on next time.

In addition, it goes without saying that even the circuit, according to Embodiment 1, in which the diode 10 is not connected, operates without any problem, as long as the off period is considerably long.

The power semiconductor element in each of Embodiments 1 and 2 may be formed of silicon. The power semiconductor element may be formed of a wide bandgap semiconductor whose bandgap is larger than that of silicon. The wide bandgap semiconductors include, for example, a silicon carbide, a material in the gallium nitride family, and a diamond.

Because such a power semiconductor element formed of a wide bandgap semiconductor has a high withstand voltage and a high allowable current density, the power semiconductor element can be downsized; by utilizing the downsized power semiconductor elements, a semiconductor device in which the power semiconductor elements are incorporated can be downsized.

Moreover, because the heat resistance thereof is also high, it is made possible to downsize the radiating fins of a heat sink and to replace the water-cooling unit by an air-cooling unit, whereby the semiconductor device can further be downsized.

Furthermore, because the power loss thereof is low, the efficiency of the power semiconductor element can be raised, whereby the efficiency of the semiconductor device can be enhanced.

As described above, the present invention has been implemented by making it clear that when the output current of the current sensing cell changes rapidly, the virtual shortcircuit between the inverting input terminal and the non-inverting input terminal of the operational amplifier is broken and hence a voltage corresponding to the change in the current of the current sensing cell appears at the inverting input terminal of the operational amplifier. In the present invention, the output of the current sensing cell is connected to the inverting input terminal of the operational amplifier and with the inverting input terminal of the comparator; the non-inverting input terminal of the operational amplifier is connected to the source of the main cell, to which the source-bias voltage is applied. In the case where the operational amplifier maintains an ideal operation, i.e., always maintains the condition of a virtual shortcircuit, the comparator does not play any role (refer to FIG. 4 of this SPECIFICATION); however, because there exists no operational amplifier that always maintains the condition of a virtual shortcircuit, the present invention is effective. The present invention is configured in such a way that an overcurrent, caused by change in a current having a changing speed that can be followed by the operational amplifier, can be detected by the operational amplifier, and an overcurrent, caused by change in a current having a changing speed that cannot be followed by the operational amplifier, can be detected by the comparator, by utilizing the fact that the virtual shortcircuit of the operational amplifier is broken. Moreover, because an overcurrent that is detected by the comparator changes rapidly, the power semiconductor element, without being broken, can withstand larger overcurrent, whereby the level, with which a given current is detected and determined as an overcurrent, can be set higher than the detection level for an overcurrent that has a low changing speed and is detected by the operational amplifier; therefore, the difference between the respective detection levels makes it possible to accurately detect an overcurrent by the operational amplifier.

Embodiment 3

Figure 8:
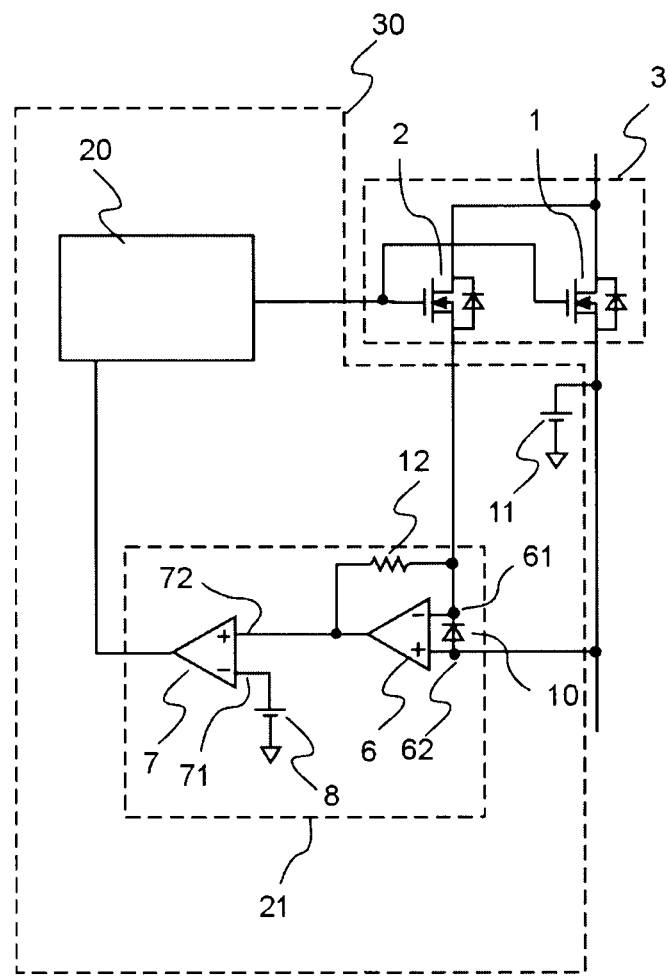
FIG. 8 is a circuit diagram illustrating a semiconductor device according to Embodiment 3 of the present invention.
Figure 9:
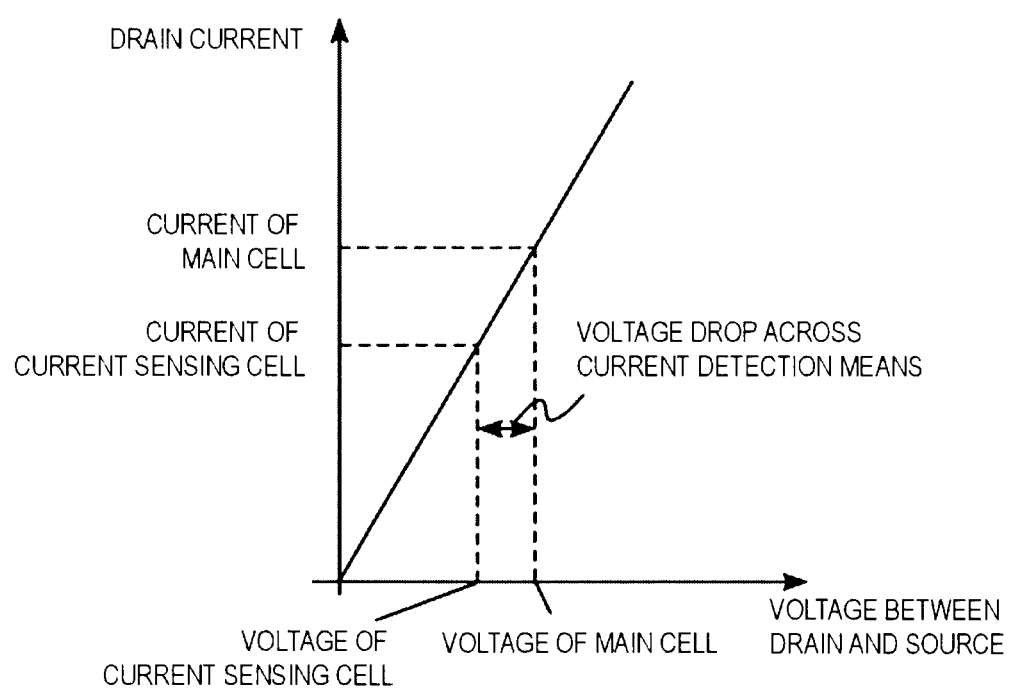
FIG. 9 is an output characteristic chart for explaining the operation of a conventional semiconductor device.

FIG. 8 is a circuit diagram illustrating a semiconductor device according to Embodiment 3 of the present invention and discloses the second invention of the present application. In FIG. 8, the same reference numerals as those in FIGS. 1 and 6 denote the same or equivalent components or elements. In Embodiment 3, the second error detection circuit 22 in Embodiment 2, i.e., in FIG. 6 is omitted. With regard to the error detection circuit, there is included only the first error detection circuit in each of Embodiments 1 and 2, i.e., the error detection circuit utilizing an operational amplifier.

As illustrated in FIG. 8, a source-bias power source 11 for applying a negative voltage (a bias voltage) between the gate and the source of a power semiconductor element is connected to the source of the main cell 1. The source terminal of the current sensing cell 2 is connected to the inverting input terminal 61 of the operational amplifier 6; a sensing resistor 12 is connected between the inverting input terminal 61 and the output terminal of the operational amplifier 6. A non-inverting input terminal 62 of the operational amplifier 6 is connected to the source terminal of the main cell 1. The operational amplifier 6 and the sensing resistor 12 configure a current/voltage conversion circuit that converts the output current of the current sensing cell into a sensing voltage, which is the voltage at the output terminal of the operational amplifier. The output terminal of the operational amplifier 6 is connected to a non-inverting input terminal 72 of a comparator 7; a reference power source 8 that supplies a reference voltage is connected to an inverting input terminal 71 of the comparator 7; the voltage at the output terminal of the operational amplifier, i.e., the sensing voltage is compared with the reference voltage. In the case where the sensing voltage is lower than the reference voltage, the comparator 7 outputs an error signal. The operational amplifier 6, the sensing resistor 12, the reference power source 8, and the comparator 7 configure an error detection circuit 21. A diode 10 is connected between the non-inverting input terminal 62 and the inverting input terminal 61 of the operational amplifier 6 in such a way that the anode thereof is connected to the non-inverting input terminal 62 and the cathode thereof is connected to the inverting input terminal 61.

As is the case with Embodiment 2, the diode 10 affects the change in the voltage at the inverting input terminal 61 of the operational amplifier 6 when the power semiconductor element turns off. The operational sequence, in the circuit in FIG. 8, of a power semiconductor element in the normal period (in which no overcurrent flows) from a time when the power semiconductor element turns on to a time point when the power semiconductor element turns off is the same as that in FIG. 7 explained in Embodiment 2. In this regard, however, in Embodiment 3, there exists no voltage that corresponds to the second reference voltage in FIG. 7. When the power semiconductor element turns on, the operation thereof is completely the same as the operation of Embodiment 1, i.e., FIG. 3. As is the case where the power semiconductor element turns on, when the power semiconductor element turns off, there is also produced a difference between the voltage at the inverting input terminal of the operational amplifier 6 and the source-bias voltage for the main cell 1, due to the limitation on the slew rate of the operational amplifier 6; however, because diode 12 performs clamping between the inverting input terminal 61 and the non-inverting input terminal 62, the voltage at the inverting input terminal 61 of the operational amplifier 6 and the source-bias voltage for the main cell 1 do not largely differ from each other; thus, the difference is only the maximum forward voltage of the diode (the difference indicated by "B" in FIG. 7). Accordingly, also in Embodiment 3 in which the error detection circuit is formed of an operational amplifier, there is effectively demonstrated the effect that there is no detection delay, which is caused due to the decrease in the voltage at the inverting input terminal of the operational amplifier 6, even in the case where an overcurrent flows in the following on period due to a short off period.

As described above, Embodiment 3, i.e., the semiconductor device in which only the first error detection circuit out of the first and second error detection circuits in Embodiment 2 is included also makes it possible to detect an overcurrent that is caused by change in a current having a changing speed that can be followed by the operational amplifier. As is the case with Embodiment 2, in this circuit, there is demonstrated an effect that in the error detection at a time when the off period is short and an overcurrent flows in the following on period, there occurs no delay that is caused by decrease in the voltage at the inverting input terminal of the operational amplifier. In the case where an operational amplifier having a large slew rate and a high response speed is utilized, an arm shortcircuit can also be detected; thus, it is considered that the invention according to Embodiment 3 is effective, in particular.

The power semiconductor element in Embodiment 3 may be formed of silicon. The power semiconductor element may be formed of a wide bandgap semiconductor whose bandgap is larger than that of silicon. The materials of wide bandgap semiconductors include, for example, a silicon carbide, a material in the gallium nitride family, and a diamond.

Because such a power semiconductor element formed of a wide bandgap semiconductor has a high withstand voltage and a high allowable current density, the power semiconductor element can be downsized; by utilizing the downsized power semiconductor elements, a semiconductor device in which the power semiconductor elements are incorporated can be downsized.

Moreover, because the heat resistance thereof is also high, it is made possible to downsize the radiating fins of a heat sink and to replace the water-cooling unit by an air-cooling unit, whereby the semiconductor device can further be downsized.

Furthermore, because the power loss thereof is low, the efficiency of the power semiconductor element can be raised, whereby the efficiency of the semiconductor device can be enhanced.

As described above, in the invention according to Embodiment 3, the output of a current sensing cell is connected to the inverting input terminal of an operational amplifier, and the non-inverting input terminal of the operational amplifier is connected to the source, of a main cell, to which a source-bias voltage is applied; a current/voltage conversion circuit configured with the operational amplifier and a sensing resistor converts the output current of the current sensing cell into a sensing voltage; there is provided an error detection circuit that compares the sensing voltage with a reference voltage and outputs an error signal; and a diode is connected between the non-inverting input terminal and the inverting input terminal of the operational amplifier in such a way that the anode thereof is connected to the non-inverting input terminal and the cathode thereof is connected to the inverting input terminal. As a result, when there is detected an overcurrent that is caused by change in a current having a changing speed that can be followed by the operational amplifier, there is demonstrated an effect that in the error detection at a time when the off period is short and an overcurrent flows in the following on period, there occurs no delay that is caused by decrease in the voltage at the inverting input terminal of the operational amplifier.

DESCRIPTION OF REFERENCE NUMERALS

1: main cell
2: current sensing cell
3: power semiconductor element
4: comparator
5: reference power source that supplies a second reference voltage
6: operational amplifier
8: reference power source that supplies a first reference voltage
10: diode
11: source-bias power source
12: sensing resistor
21: first error detection circuit
22: second error detection circuit
41: inverting input terminal of a comparator 4
42: non-inverting input terminal of the comparator 4
61: inverting input terminal of an operational amplifier 6
62: non-inverting input terminal of the operational amplifier 6

The invention claimed is:

1. A semiconductor device comprising:
a power semiconductor element including a main cell and a current sensing cell, wherein a drain of the main cell and a drain of the current sensing cell are connected together, and a current in the main cell is detected based on an output current in the current sensing cell;
an error detector including a first error detection circuit and a second error detection circuit, the first error detection circuit including an operational amplifier, wherein a source of the current sensing cell is connected to an inverting input terminal of the operational amplifier, and a source of the main cell is connected to a non-inverting input terminal of the operational amplifier;
the first error detection circuit further compares a sensing voltage, which is converted from the output current of the current sensing cell by a current/voltage conversion circuit configured with the operational amplifier and a sensing resistor, with a first reference voltage and outputs a first error signal; and
the second error detection circuit compares a voltage at the inverting input terminal of the operational amplifier with a second reference voltage set to be higher than a voltage at the non-inverting input terminal of the operational amplifier and outputs a second error signal.

2. The semiconductor device according to claim 1, further comprising:
a diode connected between the inverting input terminal and the non-inverting input terminal of the operational amplifier in such a way that the anode of the diode is connected to the non-inverting input terminal and the cathode of the diode is connected to the inverting input terminal.

3. The semiconductor device according to claim 1, wherein the power semiconductor element is formed of a wide bandgap semiconductor element.

4. The semiconductor device according to claim 3, wherein the material of the wide bandgap semiconductor element is any one of silicon carbide, gallium nitride, and diamond.

5. The semiconductor device according to claim 1, wherein a gate of the main cell and a gate of the current sensing cell are connected together.

6. The semiconductor device according to claim 1, wherein a source-bias voltage is applied to the source of the main cell.

7. An error detector for detecting an error in a current from a current-detection terminal, the error detector comprising:
a first error detection circuit including a current/voltage conversion circuit with an inverting input terminal connected to the current-detection terminal, wherein the first error detection circuit compares an output voltage of the current/voltage conversion circuit with a first reference voltage and outputs a first error signal; and
a second error detection circuit that compares a voltage at the inverting input terminal of the current/voltage conversion circuit with a second reference voltage set to be higher than a voltage at the inverting input terminal of the current/voltage conversion circuit in a state of virtual short circuit between a non-inverting input terminal of the current/voltage conversion circuit and the inverting input terminal, and outputs a second error signal.

8. The error detector according to claim 7, wherein the first reference voltage is set to be lower than a voltage at the inverting input terminal of the current/voltage conversion circuit in the state of virtual short circuit between the non-inverting input terminal and the inverting input terminal.

9. The error detector according to claim 7, further comprising:
a diode connected between the inverting input terminal and the non-inverting input terminal of the current/voltage conversion circuit in such a way that the anode of the diode is connected to the non-inverting input terminal and the cathode of the diode is connected to the inverting input terminal.

10. The error detector according to claim 7, wherein the current/voltage conversion circuit comprises an operational amplifier and a sensing resistor.

11. A power converter comprising:
a semiconductor device that includes
a power semiconductor element including a main cell and a current sensing cell, wherein a drain of the main cell and a drain of the current sensing cell are connected together, and a current in the main cell is detected based on an output current in the current sensing cell;

an error detector including a first error detection circuit and a second error detection circuit, the first error detection circuit including an operational amplifier, wherein a source of the current sensing cell is connected to an inverting input terminal of the operational amplifier, and a source of the main cell is connected to a non-inverting input terminal of the operational amplifier;

the first error detection circuit further compares a sensing voltage, which is converted from the output current of the current sensing cell by a current/voltage conversion circuit configured with the operational amplifier and a sensing resistor, with a first reference voltage and outputs a first error signal; and the second error detection circuit compares a voltage at the inverting input terminal of the operational amplifier with a second reference voltage set to be higher than a voltage at the non-inverting input terminal of the operational amplifier and outputs a second error signal.

\* \* \* \* \*